United States Patent
Lee et al.

(10) Patent No.: US 8,877,572 B2
(45) Date of Patent: Nov. 4, 2014

(54) GRAPHENE DEVICE MANUFACTURING APPARATUS AND GRAPHENE DEVICE MANUFACTURING METHOD USING THE APPARATUS

(71) Applicant: Samsung Electronics Co., Ltd., Suwon-Si (KR)

(72) Inventors: Joo-ho Lee, Hwaseong-si (KR); Yong-seok Jung, Hwaseong-si (KR); Yong-sung Kim, Namyangju-si (KR); Chang-seung Lee, Yongin-si (KR); Chang-youl Moon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 13/790,534

(22) Filed: Mar. 8, 2013

(65) Prior Publication Data

US 2014/0030857 A1   Jan. 30, 2014

(30) Foreign Application Priority Data

Jul. 27, 2012   (KR) .................. 10-2012-0082239

(51) Int. Cl.
| | |
|---|---|
| H01L 29/66 | (2006.01) |
| C25D 17/00 | (2006.01) |
| C01B 31/02 | (2006.01) |
| C25B 9/00 | (2006.01) |
| C25F 7/00 | (2006.01) |
| C25B 1/00 | (2006.01) |
| C25F 5/00 | (2006.01) |
| B82Y 40/00 | (2011.01) |

(52) U.S. Cl.
CPC ........... *H01L 29/66045* (2013.01); *B82Y 40/00* (2013.01); *C01B 31/02* (2013.01); *C25B 9/00* (2013.01); *C25F 7/00* (2013.01); *C25B 1/00* (2013.01); *C25D 17/00* (2013.01); *C25F 5/00* (2013.01)
USPC ........... 438/158; 438/455; 438/458; 204/194; 204/242

(58) Field of Classification Search
CPC ................. C01B 31/0446; C01B 31/0469
See application file for complete search history.

(56) References Cited

U.S. PATENT DOCUMENTS

| | | | |
|---|---|---|---|
| 2010/0101710 | A1 | 4/2010 | Choi et al. |
| 2010/0302337 | A1 | 12/2010 | Zhou et al. |

(Continued)

FOREIGN PATENT DOCUMENTS

| | | |
|---|---|---|
| CN | 102583356 A | 7/2012 |
| KR | 20110032999 A | 3/2011 |

(Continued)

OTHER PUBLICATIONS

Database WPI, Week 201267, Thomson Scientific, London, GB; AN 2012-L76561.

(Continued)

*Primary Examiner* — Angel Roman
(74) *Attorney, Agent, or Firm* — Harness, Dickey & Pierce, P.L.C.

(57) ABSTRACT

A graphene device manufacturing apparatus includes an electrode, a graphene structure including a metal catalyst layer formed on a substrate, a protection layer, and a graphene layer between the protection layer and the metal catalyst layer, a power unit configured to apply a voltage between the electrode and the metal catalyst layer, and an electrolyte in which the graphene structure is at least partially submerged.

27 Claims, 8 Drawing Sheets

(56) References Cited

U.S. PATENT DOCUMENTS

| | | |
|---|---|---|
| 2011/0030879 A1 | 2/2011 | Veerasamy |
| 2011/0048625 A1 | 3/2011 | Caldwell et al. |
| 2011/0068323 A1 | 3/2011 | Chen et al. |
| 2012/0069488 A1 | 3/2012 | Bulovic et al. |
| 2012/0258311 A1* | 10/2012 | Hong et al. ............ 428/408 |
| 2012/0312693 A1 | 12/2012 | Veerasamy |
| 2013/0082235 A1* | 4/2013 | Gu et al. ................ 257/9 |
| 2013/0082242 A1* | 4/2013 | Han et al. .............. 257/29 |
| 2014/0037963 A1 | 2/2014 | Song ..................... 428/408 |
| 2014/0076738 A1* | 3/2014 | Han et al. .............. 205/674 |
| 2014/0130972 A1* | 5/2014 | Ren et al. .............. 156/249 |

FOREIGN PATENT DOCUMENTS

| | | |
|---|---|---|
| KR | 20110054386 A | 5/2011 |
| KR | 20110109680 A | 10/2011 |
| KR | 20110131225 A | 12/2011 |
| KR | 20120029256 A | 3/2012 |
| KR | 20120030780 A | 3/2012 |
| KR | 20120034419 A | 4/2012 |

OTHER PUBLICATIONS

Gao, Libo et al. "Repeated growth and bubbling transfer of graphene with millimetre-size single-crystal grains using platinum," *Nature Communications*, Nature Publishing Group, London, UK, vol. 3, Feb. 28, 2012.

Extended European Search Report dated May 14, 2014 issued in corresponding European Application No. 13162775.4.

Yu Wang, Electrochemical Delamination of CVD-Grown Graphene Film: Toward the Recyclable Use of Copper Catalyst, American Chemical Society, Oct. 30, 2011, DOI: 10.1021/nn203700w.

* cited by examiner

GRAPHENE DEVICE MANUFACTURING APPARATUS AND GRAPHENE DEVICE MANUFACTURING METHOD USING THE APPARATUS

CROSS-REFERENCE TO RELATED APPLICATIONS

This application claims the benefit of priority under 35 U.S.C. §119 from Korean Patent Application No. 10-2012-0082239, filed on Jul. 27, 2012, in the Korean Intellectual Property Office, the disclosure of which is incorporated herein by reference in its entirety.

BACKGROUND

1. Field

The present disclosure relates to a graphene device manufacturing apparatus and a graphene device manufacturing method using the apparatus.

2. Description of the Related Art

Graphene is a material having 2-dimensional hexagonal carbon structure and is as thin as one-atom thick sheet. Also, graphene may conduct electricity 100 times faster than a single crystal silicon, which is mainly used as a semiconductor. Graphene is a zero gap semiconductor that may serve as an alternate for a conventional semiconductor material, and thus attention is drawn to graphene as a base material for electronic circuits.

Graphene is normally formed on a metal thin layer (i.e., Cu or Ni) by using a chemical vapor deposition method, or formed on a SiC substrate by using a thermal decomposition method. However, graphene needs to be grown on an insulation layer in order to use a graphene thin layer in a semiconductor device or the like, and it has been difficult to form a graphene thin layer of a high quality on an insulation layer with the latest techniques.

SUMMARY

Provided are an apparatus for manufacturing a graphene device and a method of manufacturing a graphene device using the apparatus.

According to example embodiments, a graphene device manufacturing apparatus includes an electrode, a graphene structure including a metal catalyst layer on a substrate, a protection layer, and a graphene layer between the metal catalyst layer and the protection layer, a power unit configured to apply a voltage between the electrode and the metal catalyst layer, and an electrolyte in which the graphene structure is at least partially submerged.

An insulation layer may be between the substrate and the metal catalyst layer, and the insulation layer may include an oxide. The insulation layer may be partially etched to form a region where the substrate and the metal catalyst layer directly contact each other.

The substrate may be a conductive substrate, and the power unit may be connected to the conductive substrate to apply the voltage to the metal catalyst layer.

The electrolyte may be formed of an aqueous solution of one selected from $K_2S_2O_8$ and $FeCl_3$.

The metal catalyst layer may include at least one selected from Cu, Ni, Fe, Co, Pt, and Ru.

The graphene device manufacturing apparatus may include a tank containing the electrolyte and the graphene structure.

According to other example embodiments, a graphene device manufacturing method includes forming a graphene structure including a metal catalyst layer formed on a substrate, a protection layer, and a graphene layer between the metal catalyst layer and the protection layer; separating the metal catalyst layer from the substrate by generating bubbles due to chemical reactions occurring in an area between the substrate and the metal catalyst layer; removing the metal catalyst layer separated from the substrate from the graphene structure; forming a target insulation layer to be contacted with the graphene layer on a target substrate; contacting the graphene layer on the target insulation layer on the target substrate; and removing the protection layer from the graphene structure, after contacting the graphene layer on the target insulation layer.

The separating of the metal catalyst layer from the substrate may include placing the graphene structure in a tank containing an electrolyte and an electrode, and applying a voltage between the metal catalyst layer and the electrode.

The substrate may be a conductive substrate, and wherein a voltage may be applied between the conductive substrate and the electrode.

The electrolyte may be formed of a solution prepared by mixing $K_2S_2O_8$ or $FeCl_3$ with water.

The removing of the metal catalyst layer separated from the substrate may include using a wet etching method.

The contacting of the graphene layer on the target insulation may include surface treating the target insulation layer to form hydroxyl (—OH) groups on a surface of the target insulation layer.

The surface treating of the target insulation layer may include using a RCA cleaning technique.

The contacting of the graphene layer on the target insulation layer may include using a vacuum pressing method to contact the target insulation and the graphene layer.

The forming of the graphene structure further may include forming an insulation layer between the substrate and the metal catalyst layer. The forming of the insulation layer may include forming an oxide by oxidation of a surface of the substrate.

The method may include partially etching the insulation layer so as to form a region where the substrate and the metal catalyst layer directly contact each other.

The protection layer may be formed of polymethyl methacrylate (PMMA) in the forming of the graphene structure.

The protection layer may be formed of one selected from adhesive tape, glue, epoxy resin, thermal release tape, water-soluble tape, UV tape, patternable dry film, and a photoresist material. The epoxy resin may polycarbonate (PC), and the photoresist material may SU-8.

The protection layer may include a first layer formed of PMMA and a second layer formed of one selected from adhesive tape, glue, epoxy resin, thermal release tape, water-soluble tape, UV tape, patternable dry film, and a photoresist material.

Forming a first electrode and a second electrode on the graphene layer may be further included, after removing the protection layer.

The contacting of the graphene layer on the target insulation layer may include forming a gate electrode between the target substrate and the target insulation layer. The method may further include forming a source electrode and a drain electrode on the graphene layer, after the removing of the protection layer.

The generating of the bubbles includes forming bodies of a gas within a liquid electrolyte, and the gas is air.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

DETAILED DESCRIPTION

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to a graphene device manufacturing apparatus and a graphene device manufacturing method using the apparatus.

Figure 1:
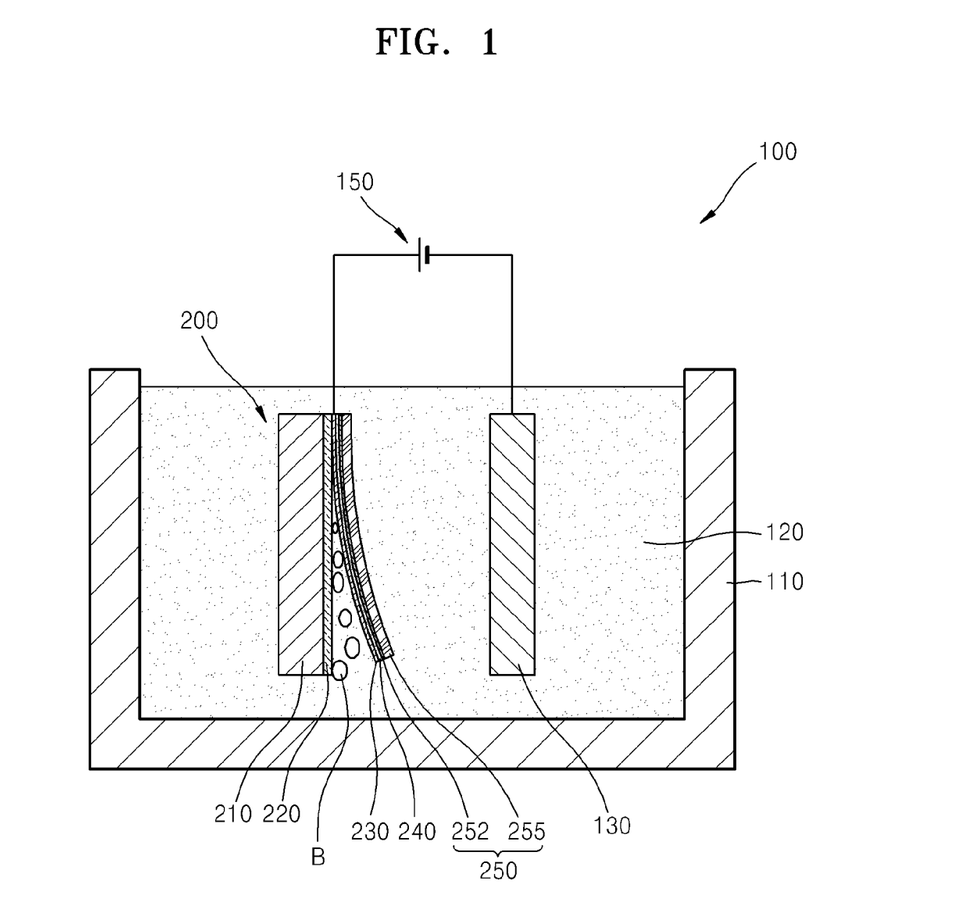
FIG. 1 illustrates a schematic structure of a graphene device manufacturing apparatus according to example embodiments.

FIG. 1 illustrates a schematic structure of a graphene device manufacturing apparatus according to example embodiments.

Referring to FIG. 1, a graphene device manufacturing apparatus 100 according to example embodiments is an apparatus for separating a metal catalyst layer 230 from a substrate 210 in a graphene structure 200 including the graphene layer 240 formed on a metal catalyst layer 230 to transfer a graphene on a target substrate.

The graphene device manufacturing apparatus 100 includes an electrode 130, the graphene structure 200, a power unit 150 applying a voltage between the electrode 130 and the metal catalyst layer 230, a tank 110 containing the electrode 130 and the graphene structure 200, and an electrolyte 120 filling the tank 120.

The graphene structure 200 includes the substrate 210, the metal catalyst layer 230 formed on the substrate 210, the graphene layer 240 formed on the metal catalyst layer 230, and a protection layer 250 formed on the graphene layer 240.

The substrate 210 may be a conductive substrate, for example, a low-resistivity silicon substrate.

The metal catalyst 230 may include any of copper (Cu), nickel (Ni), iron (Fe), cobalt (Co), platinum (Pt), and ruthenium (Ru).

Also, an insulation layer 220 may be further prepared between the substrate 210 and the metal catalyst layer 230. The insulation layer 220 may be formed of an oxide (e.g., a silicon oxide) that is formed by oxidizing a surface of the substrate, or formed of a nitride.

The protection layer 250 is prepared to protect and support the graphene layer 240. The protection layer 250 may have a structure of multiple layers including a first layer 252 and a second layer 255 as shown in FIG. 1. The first layer 252 may be formed of, for example, polymethyl methacrylate (PMMA). The second layer 255 may be formed of adhesive tape, glue, epoxy resin (e.g., polycarbonate (PC)), thermal release tape, water-soluble tape, UV tape, patternable dry film, or a photoresist material (e.g., SU-8). The photoresist material may be negative photoresist. However, the bi-layer structure of the protection layer 250 is an example, and only one of the first and second layers 252 and 255 may be included.

The electrolyte 120 may be formed of a solution prepared by mixing $K_2S_2O_8$ or $FeCl_3$ with water.

FIG. 1 shows that the metal catalyst layer 230 and the electrode 130 are connected so as to be positive and negative, respectively. However, the structure is not limited thereto, and the metal catalyst layer 230 and the electrode 130 may be connected so as to have the opposite polarity.

When a voltage is applied between the metal catalyst layer 230 and the electrode 130 from the power unit 150, the metal catalyst layer 230 is separated from the substrate 210 due to bubbles B generated by chemical reactions occurring in the electrolyte 120.

For example, when the metal catalyst layer 230 is formed of Cu, and the electrolyte 120 is formed of a solution of a $K_2S_2O_8$ and water mixture, and when a voltage is applied so that the metal catalyst layer 230 is negative and the electrode 130 is positive, the following chemical reactions may occur in the electrolyte 120 as follows in Chemical Reaction Scheme 1.

Chemical Reaction Scheme 1

Due to the hydrogen bubbles ($H_2$ bubbles) generated by the chemical reactions, the metal catalyst layer 230 is separated from the substrate 210.

The chemical reactions occurring in the electrolyte 120 are exemplary and not limited to the reactions shown in Chemical Reaction Scheme 1. For example, when the metal catalyst layer 230 is positive and the electrode 130 is negative, oxygen bubbles ($O_2$ bubble) may be generated, and accordingly the metal catalyst layer 230 may be separated from the substrate 210.

A time or type of the separation of the metal catalyst layer 230 from the substrate 210 may be adjusted by controlling a voltage applied between the metal catalyst layer 230 and the electrode 210, and a concentration of the electrolyte 120. In this regard, when air bubbles using chemical reactions are used, damage on the graphene layer 240 may be prevented.

Figure 2:
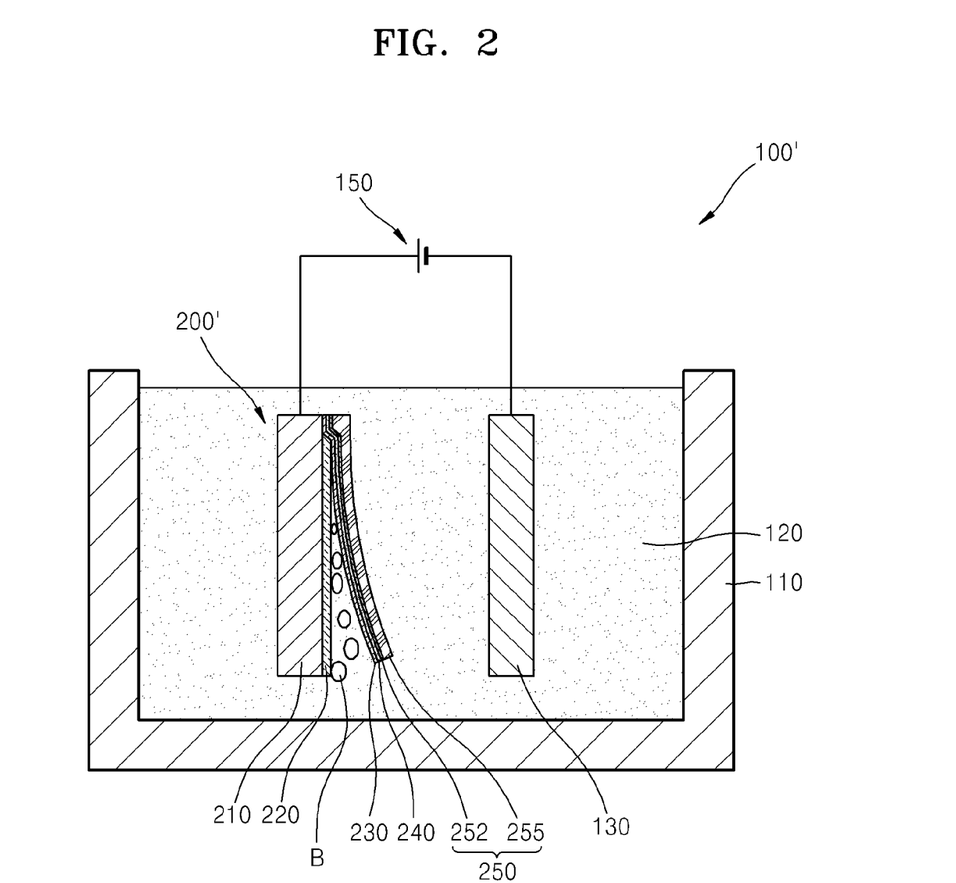
FIG. 2 illustrates a schematic structure a graphene device manufacturing apparatus according to other example embodiments.

FIG. 2 illustrates a schematic structure a graphene device manufacturing apparatus according to other example embodiments.

In FIG. 2, a graphene device manufacturing apparatus 100' is provided. The graphene device manufacturing apparatus 100' is different from the graphene device manufacturing apparatus 100 of FIG. 1 in that a part of the insulation layer 220 is etched, and thus a region where the substrate 210 and the metal catalyst layer 230 directly meet (or contact) each other is prepared.

In the present example embodiments, the substrate 210 is a conductive substrate, thus the substrate 210 may be directly connected to the power unit 150 to apply a voltage between the metal catalyst layer 230 and the electrode 130. Also, as stated above, polarity of the substrate 210 and the electrode connected to the power unit 150 may be changed oppositely.

Hereinafter, a graphene device manufacturing method according to example embodiments will be described in detail with reference to FIGS. 3A to 3H.

FIGS. 3A to 3H illustrate a graphene device manufacturing method according to example embodiments.

Figure 3A:
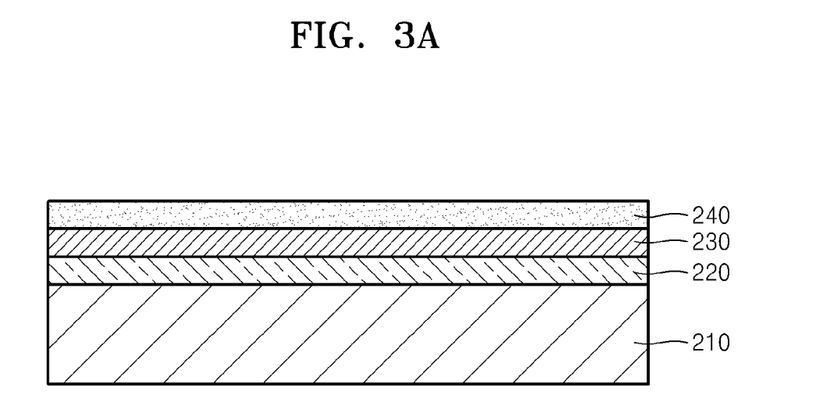
FIGS. 3A to 3H illustrate a graphene device manufacturing method according to example embodiments.

Referring to FIG. 3A, a structure is formed including the substrate 210, the metal catalyst layer 230 formed on the substrate 210, the graphene layer 240 formed on the metal catalyst layer 230, and the protection layer 250 formed on the graphene layer 240.

The substrate 210 may be a conductive substrate, for example, a low-resistivity silicon substrate.

The metal catalyst layer 230 may include a metal material including any of Cu, Ni, Fe, Co, Pt, and Ru. Such metal material may be formed through a deposition process using a sputtering apparatus, an e-beam evaporator apparatus, or the like.

Also, an insulation layer 220 may be further prepared between the substrate 210 and the metal catalyst layer 230. The insulation layer 220 may be formed of an oxide that is formed by oxidizing a surface of the substrate, for example a silicon oxide, or formed of a nitride.

The graphene layer 240 may be formed by using a chemical vapor deposition (CVD) method. The substrate 210 with the metal catalyst layer 230 formed thereon and a gas containing carbon ($CH_4$, $C_2H_2$, $C_2H_4$, or CO) are put into a reactor for thermal chemical vapor deposition or inductive coupled plasma chemical vapor deposition (ICP-CVD) and heated so the carbon is absorbed in the metal catalyst layer 230. Subsequently, the carbon may be separated from the metal catalyst layer 230 and crystallized by rapidly cooling the resultant, thereby growing graphene.

Figure 3B:
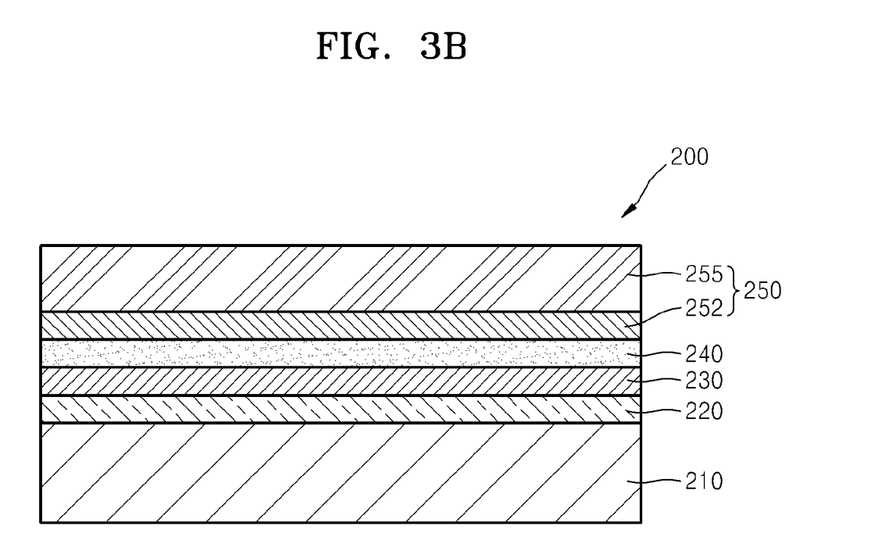

Referring to FIG. 3B, a graphene structure 200 is prepared by forming the protective layer 250 on the graphene layer 240. The protection layer 250 is prepared to protect and support the graphene layer 240. The protection layer 250 may have a structure of multiple layers including a first layer 252 and a second layer 255. The first layer 252 may be formed by spin-coating, for example, PMMA. The second layer 255 may be formed of adhesive tape, glue, epoxy resin (e.g., PC), thermal release tape, water-soluble tape, UV tape, patternable dry film, or a photoresist material (e.g., SU-8). However, the structure is an example embodiment, and, alternatively, only one of the first and second layers 252 and 255 may be included.

Figure 3C:
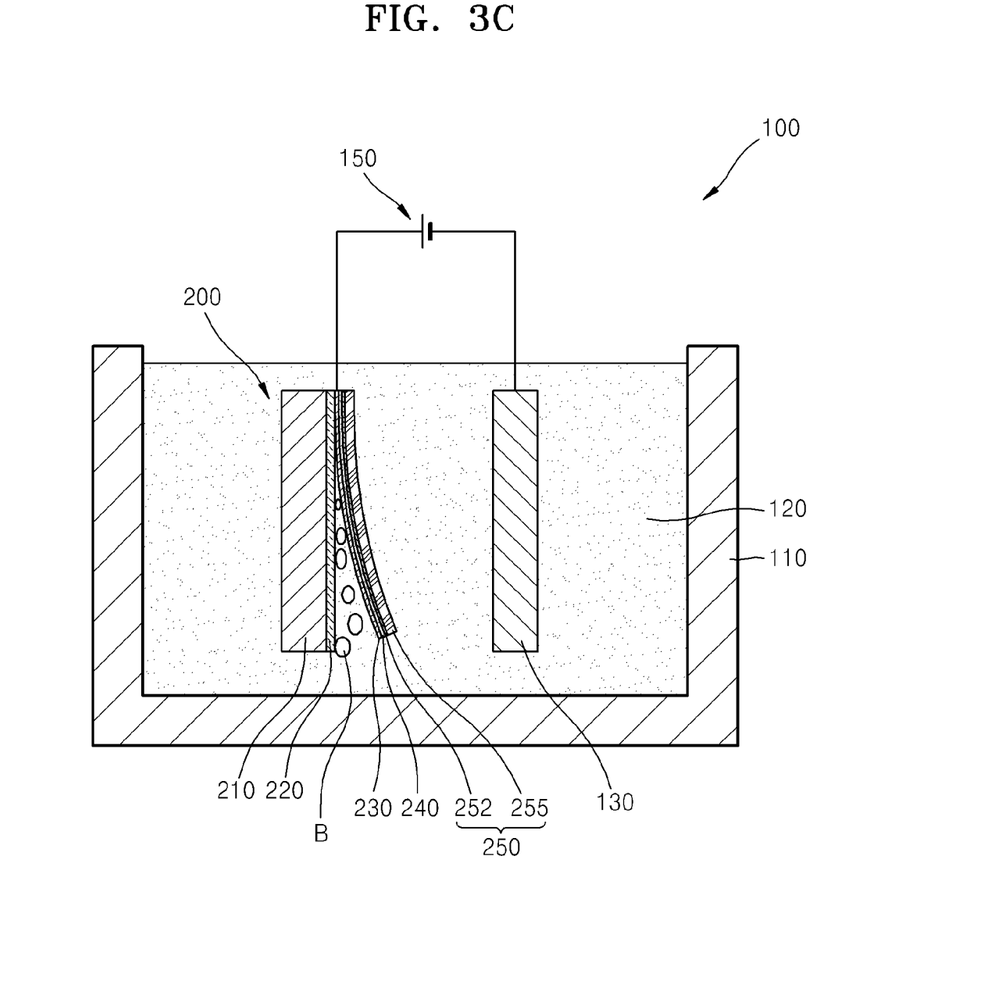

Referring to FIG. 3C, the substrate 210 is separated from the metal catalyst layer 230 by putting the graphene structure 200 in the tank 110 filled with the electrolyte 120 to allow the chemical reactions to occur.

The electrode 130 is placed in the tank 110. A voltage is applied between the electrode 130 and the metal catalyst layer 230. When a voltage is applied between the metal catalyst layer 230 and the electrode 130 from the power unit 150, the air bubbles B are generated between the metal catalyst layer 230 and the electrode 130 due to the chemical reactions occurring in the electrolyte 120, and thus the substrate 210 is separated from the metal catalyst layer 230. When the metal catalyst layer 230 is formed of Cu, and the electrolyte is formed of a solution of a $K_2S_2O_8$ and water mixture, the aforementioned Chemical Reaction Scheme 1 may occur in the electrolyte 120.

In FIGS. 3A and 3B, a graphene structure may be formed with a region where the substrate 210 and the metal catalyst layer 230 directly meet (or contact) each other. The region where the substrate 210 and the metal catalyst layer 230 directly meet (or contact) is prepared by etching a part of the insulation layer 220 in the same manner as a graphene structure 200' of FIG. 2 is formed. In this regard, as described for graphene structure 200' of FIG. 2, a voltage may be applied between the substrate 210 and the electrode 130.

Next, the metal catalyst layer 230 is removed from the structure including the metal catalyst layer 230 separated from the step of FIG. 3C, the graphene layer 240, and the protection layer 250. The removal of the metal catalyst layer 230 may be performed by using a wet etching method, and a solution is selected depending on a metal material forming the metal catalyst layer 230.

Figure 3D:
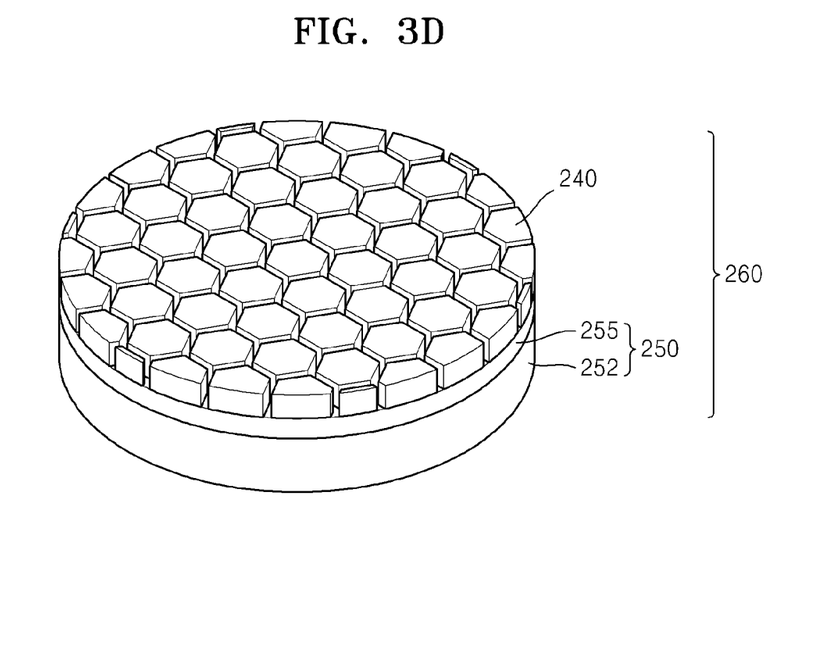

Referring to FIG. 3D, a structure 260 including the graphene layer 240 remaining on the protection layer 250 is realized.

Figure 3E:
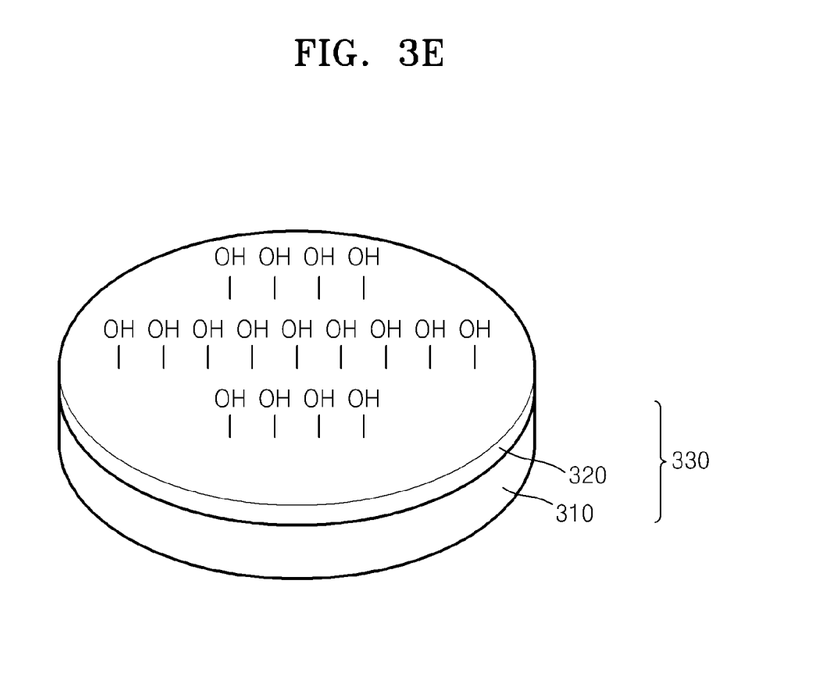

Referring to FIG. 3E, a structure 330 including a target substrate 310 on which the graphene layer 240 will be transferred is prepared. A target insulation layer 320 may be formed on the target substrate 310. A surface of the target insulation layer 320 may be surface treated so that hydroxyl (—OH) groups can be formed thereon, and the surface treatment may be performed by using a RCA cleaning technique.

Figure 3F:
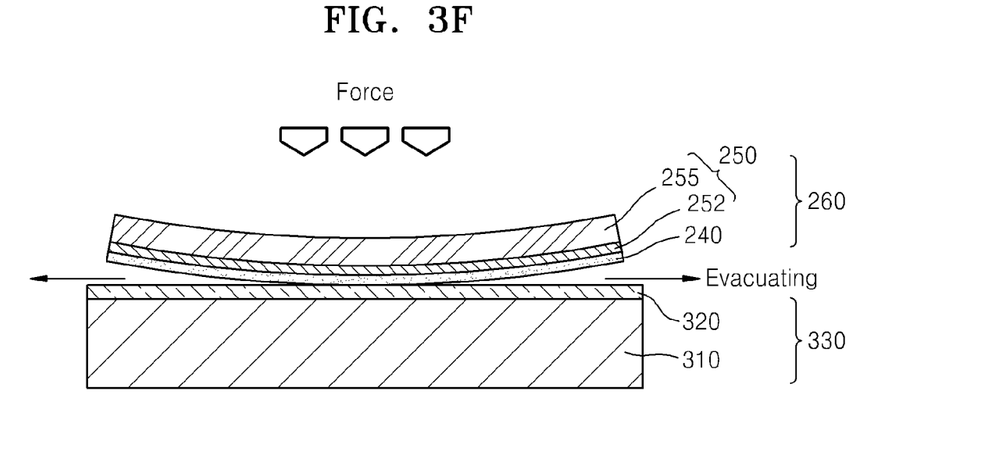

Referring to FIG. 3F, the structure 260 of FIG. 3D and the structure 330 of FIG. 3E are vacuum pressed. The structures 260 and 330 of FIGS. 3D and 3E may be vacuum pressed by placing the structure 260 of FIG. 3D and the structure 330 of FIG. 3E so that the graphene layer 240 and the target insulation layer 320 face each other, evacuating a space between the graphene layer 240 and the target insulation layer 320, and applying force.

Figure 3G:
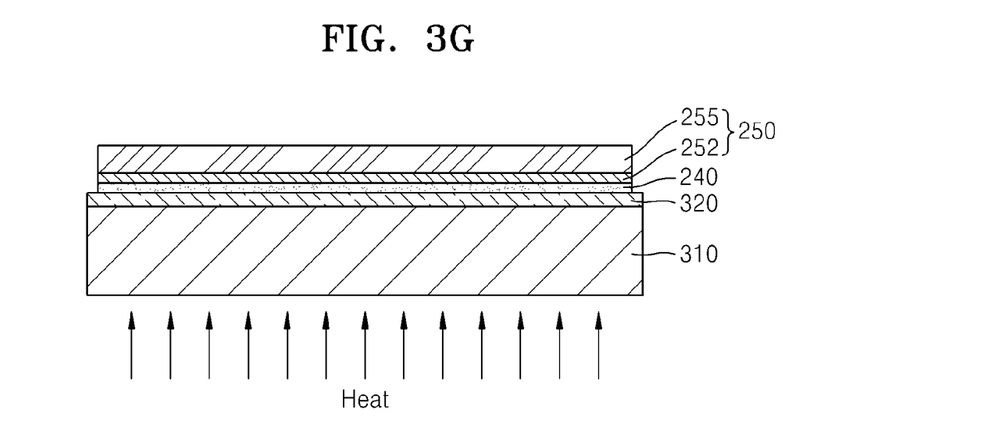

Referring to FIG. 3G, heat is applied to remove the protection layer 250. A method using heat is exemplary, and thus a method of removing the protection layer 250 may vary depending on a particular material of the protection layer 250.

Figure 3H:
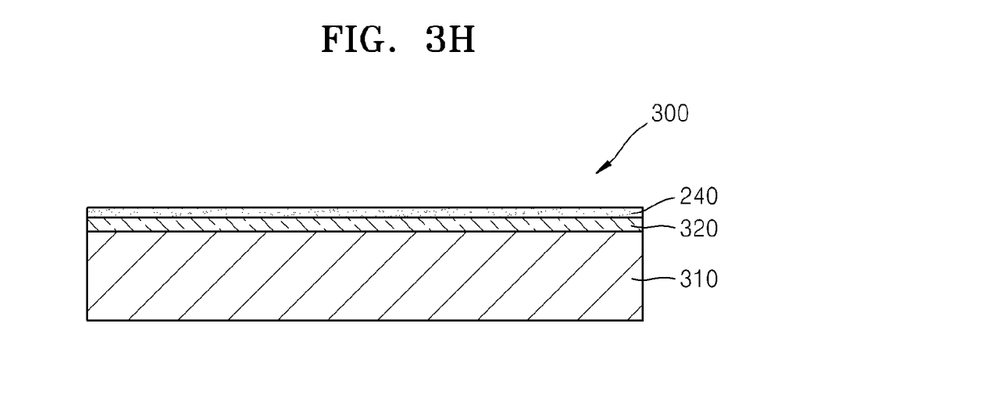

Referring to FIG. 3H, a graphene device 300 including the graphene layer 240 is transferred on the target insulation layer 320 on the target substrate 310.

Figure 4:
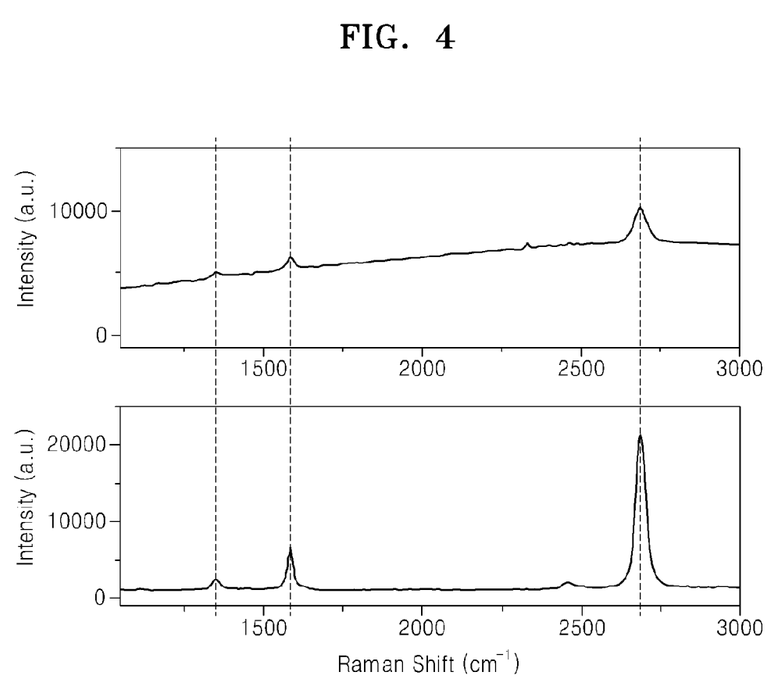
FIG. 4 is a graph illustrating Raman Shift after transferring a graphene layer on a target substrate.

FIG. 4 is a graph illustrating Raman Shift before and after transferring a graphene layer on a target substrate.

Raman Shift is a graph used to determine the presence of graphene, and the same location of Raman Shift in a graph before transferring the graphene layer on the target substrate (top) and a graph after transferring the graphene layer on the target substrate (bottom) indicates that the graphene layer is well transferred on the target substrate without damage.

Figure 5:
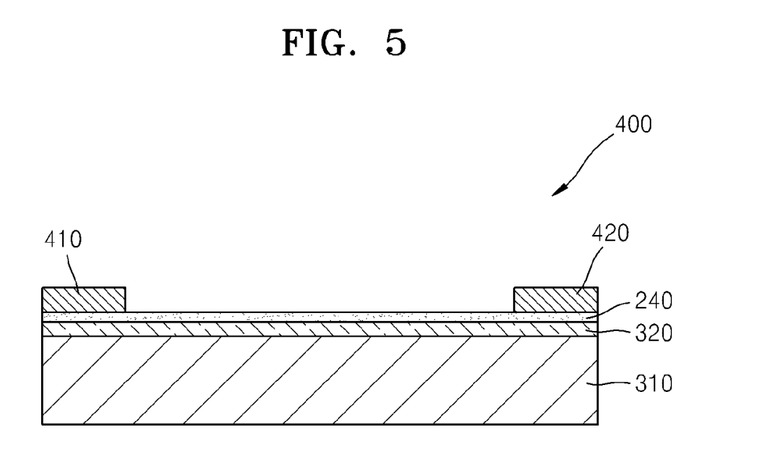
FIG. 5 illustrates a structure of a graphene device manufactured by a graphene device manufacturing method according to example embodiments.

FIG. 5 illustrates a structure of a graphene device manufactured by a graphene device manufacturing method according to example embodiments.

Referring to FIG. 5, when a process of forming a first electrode 410 and a second electrode 420 on the graphene layer 240 after the step of FIG. 3H is further performed, a graphene device 400 may be manufactured. The graphene device 400 may be used as a sensor (i.e., the graphene layer 240 may serve as a sensor), and thus a change in electrical characteristics due to adhesion of a particular material or the like may be measured by the first and second electrodes 410 and 420.

Figure 6:
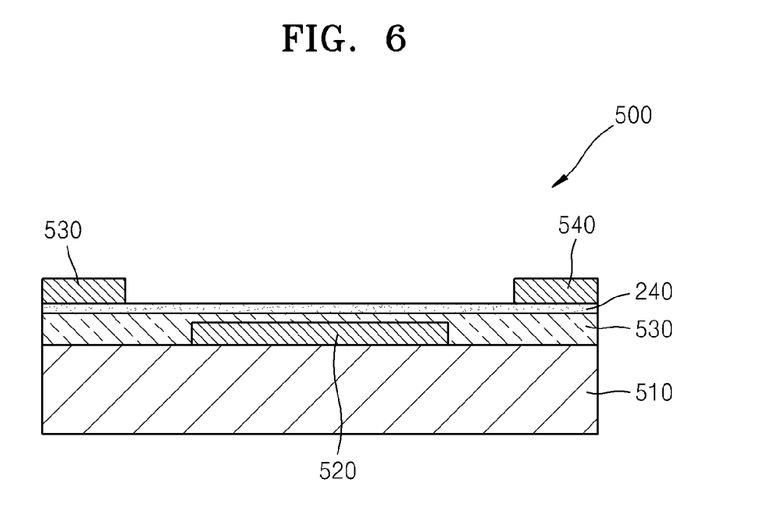
FIG. 6 illustrates another structure of a graphene device manufactured by a graphene device manufacturing method according to other example embodiments.

FIG. 6 illustrates another structure of a graphene device manufactured by a graphene device manufacturing method according to other example embodiments.

Referring to FIG. 6, a graphene device 500 is manufactured using similar steps as shown in FIGS. 3A-3H, except that, between the steps shown in FIGS. 3D and 3E, a structure including a gate electrode 520 formed on a target substrate 510 and an insulation layer 530 covering the gate electrode 520 is provided. The graphene layer 240 of FIG. 3D may be transferred onto the insulation layer 530. Also, a source electrode 530 and a drain electrode 540 may be formed on the graphene layer 240. The graphene device 500 may be a transistor in which the graphene layer 240 serves as a channel layer.

As described above, according to example embodiments, a metal catalyst layer on which graphene is formed may be separated from a substrate using chemical reactions. Thus, damage on the graphene layer caused by using mechanical force may be minimized, the graphene layer of a good quality may be transferred on a target substrate, and a graphene device of a high quality may be manufactured.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A graphene device manufacturing apparatus, comprising:
   an electrode;
   a graphene structure including a metal catalyst layer on a substrate, a protection layer, and a graphene layer between the metal catalyst layer and protection layer;
   a power unit configured to apply a voltage between the electrode and the metal catalyst layer; and
   an electrolyte in which the graphene structure is at least partially submerged.

2. The graphene device manufacturing apparatus of claim 1, further comprising:

an insulation layer between the substrate and the metal catalyst layer.

3. The graphene device manufacturing apparatus of claim 2, wherein the insulation layer includes an oxide.

4. The graphene device manufacturing apparatus of claim 2, wherein the insulation layer is partially etched to form a region where the substrate and the metal catalyst layer directly contact each other.

5. The graphene device manufacturing apparatus of claim 4, wherein the substrate is a conductive substrate, and
the power unit is connected to the conductive substrate to apply the voltage to the metal catalyst layer.

6. The graphene device manufacturing apparatus of claim 1, wherein the electrolyte includes an aqueous solution of one selected from $K_2S_2O_8$ and $FeCl_3$.

7. The graphene device manufacturing apparatus of claim 1, wherein the metal catalyst layer includes at least one selected from Cu, Ni, Fe, Co, Pt, and Ru.

8. The graphene device manufacturing apparatus of claim 1, further comprising:
a tank containing the electrolyte and the graphene structure.

9. A graphene device manufacturing method, comprising:
forming a graphene structure including a metal catalyst layer on a substrate, a protection layer, and a graphene layer between the metal catalyst layer and protection layer;
separating the metal catalyst layer from the substrate by generating bubbles due to chemical reactions occurring in an area between the substrate and the metal catalyst layer;
removing the metal catalyst layer separated from the substrate from the graphene structure;
forming a target insulation layer to be contacted with the graphene layer on a target substrate;
contacting the graphene layer on the target insulation layer on the target substrate; and
removing the protection layer from the graphene structure, after contacting the graphene layer on the target insulation layer.

10. The graphene device manufacturing method of claim 9, wherein the separating of the metal catalyst layer from the substrate includes,
placing the graphene structure in a tank containing an electrolyte and an electrode, and
applying a voltage between the metal catalyst layer and the electrode.

11. The graphene device manufacturing method of claim 10, wherein the substrate is a conductive substrate, and
the method further comprises:
applying a voltage between the conductive substrate and the electrode.

12. The graphene device manufacturing method of claim 10, wherein the electrolyte is formed of a solution prepared by mixing $K_2S_2O_8$ or $FeCl_3$ with water.

13. The graphene device manufacturing method of claim 9, wherein removing of the metal catalyst layer separated from the substrate includes using a wet etching method.

14. The graphene device manufacturing method of claim 9, wherein the contacting of the graphene layer on the target insulation includes surface treating the target insulation layer to form hydroxyl (—OH) groups on a surface of the target insulation layer.

15. The graphene device manufacturing method of claim 14, wherein the surface treating of the target insulation layer includes using a RCA cleaning technique.

16. The graphene device manufacturing method of claim 9, wherein the contacting of the graphene layer on the target insulation layer includes using a vacuum pressing method to contact the target insulation and the graphene layer.

17. The graphene device manufacturing method of claim 9, wherein the forming of the graphene structure includes forming an insulation layer between the substrate and the metal catalyst layer.

18. The graphene device manufacturing method of claim 17, wherein the forming the insulation layer includes forming an oxide by oxidation of a surface of the substrate.

19. The graphene device manufacturing method of claim 17, further comprising:
partially etching the insulation layer so as to form a region where the substrate and the metal catalyst layer directly contact each other.

20. The graphene device manufacturing method of claim 9, wherein the protection layer is formed of polymethyl methacrylate (PMMA).

21. The graphene device manufacturing method of claim 9, wherein the protection layer is formed of one selected from adhesive tape, glue, epoxy resin, thermal release tape, water-soluble tape, UV tape, patternable dry film and a photoresist material.

22. The graphene device manufacturing method of claim 21, wherein the epoxy resin is polycarbonate (PC), and the photoresist material is SU-8.

23. The graphene device manufacturing method of claim 9, wherein the protection layer includes a first layer formed of PMMA and a second layer formed of one selected from adhesive tape, glue, epoxy resin, thermal release tape, water-soluble tape, UV tape, patternable dry film, and a photoresist material.

24. The graphene device manufacturing method of claim 23, wherein the epoxy resin is polycarbonate (PC), and the photoresist material is SU-8.

25. The graphene device manufacturing method of claim 9, further comprising:
forming a first electrode and a second electrode on the graphene layer, after removing the protection layer.

26. The graphene device manufacturing method of claim 9, wherein the contacting of the graphene layer on the target insulation layer includes forming a gate electrode between the target substrate and the target insulation layer.

27. The graphene device manufacturing method of claim 26, further comprising:
forming a source electrode and a drain electrode on the graphene layer, after the removing of the protection layer.

* * * * *